(12) United States Patent
Kohnen et al.

(10) Patent No.: US 6,799,288 B2
(45) Date of Patent: Sep. 28, 2004

(54) DETECTING AND MITIGATING MEMORY DEVICE LATCHUP IN A DATA PROCESSOR

(75) Inventors: Kirk K. Kohnen, Fullerton, CA (US); Billy Fitzgibbons, Seal Beach, CA (US)

(73) Assignee: The Boeing Company, Seattle, WA (US)

( * ) Notice: Subject to any disclaimer, the term of this patent is extended or adjusted under 35 U.S.C. 154(b) by 351 days.

(21) Appl. No.: 09/952,618

(22) Filed: Sep. 14, 2001

(65) Prior Publication Data

US 2003/0056160 A1 Mar. 20, 2003

(51) Int. Cl.[7] ................................................. G11C 29/00
(52) U.S. Cl. ...................................... 714/718; 714/764
(58) Field of Search ................................. 714/718, 719, 714/746, 747, 752, 763, 764, 12; 365/200, 201

(56) References Cited

U.S. PATENT DOCUMENTS 6,560,725 B1 * 5/2003 Longwell et al. ............. 714/54

* cited by examiner

*Primary Examiner*—Albert Decady
*Assistant Examiner*—James Kerveros
(74) *Attorney, Agent, or Firm*—Gates & Cooper LLP

(57) ABSTRACT

An method, apparatus and article of manufacture for detecting and correcting memory device failures includig detecting errors in data stored in a memory device from the data transacted with a processor, correcting the detected errors in the data transacted with the processor, tracking the detected errors in the memory device, determining when the memory device has failed based upon the tracked detected errors and resetting the memory device when the memory device fails testing, and further, identifying erroneous latch-ups detected soon after powering and correcting errors such that no erroneous data is transacted with the processor.

36 Claims, 3 Drawing Sheets

DETECTING AND MITIGATING MEMORY DEVICE LATCHUP IN A DATA PROCESSOR

BACKGROUND OF THE INVENTION

1. Field of the Invention

The present invention relates to systems and methods for detecting and responding to errors and failures in a memory device, and particularly, for such systems and methods in space applications.

2. Description of the Related Art

Computer memory and other semiconductor components are susceptible to environmental effects which can cause them to fail. One class of failures occurs as a result of exposure to radiation. The environmental conditions for space applications present radiation which produces this class of failures. Such radiation can be devastating to a satellite lacking adequate safeguards. When cosmic radiation passes through a sensitive semiconductor component in a satellite, one of three possible conditions may result.

In a microprocessor or RAM chip, a single-event upset (SEU) can occur wherein the contents of a particular memory address or register are inverted (e.g. a bit flips from 0 to 1). As a result, sensor data can be corrupted, algorithms can fail, and the satellite firmware can be adversely affected. A corrupted program could attempt to execute random code or data in the memory may be lost.

The second condition is a single-event latchup (SEL). In this case, the affected component latches into a state where it dissipates a dangerously high amount of current, until the power to the device is reset. If the current is not limited, the system power supply may also fail, or its voltage may dip down below acceptable levels for normal system operation, affecting many other major onboard systems. Also, if the device is not rated for the high current dissipation, it may be destroyed.

The third condition induced by cosmic radiation is a single-event burnout (SEB). In this case, the affected device is destroyed immediately following exposure. Unlike SEUs and SELs (where the device is not destroyed and may be reset), the only adequate response to an SEB is to invoke a redundant device.

Furthermore, different semiconductor devices have different susceptibilities to radiation induced failures. Some device designs may reduce (or virtually eliminate) the risk of a radiation induced failure, however, it is often not reasonable to apply such techniques to every semiconductor device. In general, the higher the capacity of a memory device, the more susceptible it is to failures, including latchup. Thus, very high capacity memory devices, e.g. 64 Mbit devices, have a relatively high susceptibility. Therefore, systems and methods to protect these devices are especially important.

FIG. 1 is a block diagram of a typical prior art system 100 for latchup detection and mitigation. The system 100 includes hardware detection and reset components entirely separate from the software and other operations of the computer system 102 which it monitors. The monitored computer system 102 includes a central processing unit (CPU) 104, one or more memory devices 106, such as silicon based SDRAM and input/output devices 108 which are used to monitor and control various subsystems. The CPU 104 utilizes the memory 106, comprising one or more memory devices 106A, 106B, to store programs data and information which are being processed and used by the computer 102. Program data and information are transferred between the CPU 104 and memory 106 via the data bus 110 as the computer 102 operates.

The latchup detection and mitigation system 100 operates by monitoring the current consumption of the memory 106 via links 112. Harmful radiation 114 may impinge at least one of the memory devices 106A, causing a single event latchup (SEL) in the memory device 106A. As a result, the latched up memory device 106A begins to draw an excessive amount of current from the memory power supply 116. The current measurement hardware 118 is continually monitoring the current draw by the memory devices 106 from the power supply 116 and relays the information to the threshold detection hardware 120. When an unsafe threshold is reached by any of the memory devices 106, the detection hardware 120 signals a reset to power supply for at least the affected memory device 106A. For simple processor designs in which the power supply powers both the memories and the processor, the power supply reset will shut down power to the entire processor 102.

The additional hardware adds to the cost and mass of the overall computer system 100. In addition, the hardware of the described system 100 increases the complexity and reduces the reliability of the computer system 102. Furthermore, this system 100 only detects and eliminates SELs that result in an excessive current draw which could damage or destroy hardware. It does not check for SEUs or other innocuous memory failures which do not result in a high current draw. Finally, because the system is hardware based, it is not easily or inexpensively altered to meet a change in requirements or to implement improvements.

There is a need for systems and methods which can detect and respond appropriately to single event failures of any type. If a memory device latches up so that it completely fails, power needs to be removed from it in a timely manner, even if that means immediately shutting down the entire processor. On the other hand, if the memory experiences a SEU, the system and method need to correct the error(s) without interrupting the functionality of the processor. Furthermore, there is a need for such systems and methods to function without requiring additional hardware components. There is also a need for such systems and methods to be inexpensive, reliable, light and easily modified. The present invention meets all of these needs.

SUMMARY OF THE INVENTION

The present invention discloses an apparatus, method and article of manufacture for detecting memory device failures. The exemplary method comprises detecting errors in data stored in a memory device from the data transacted with a processor, correcting the detected errors in the data transacted with the processor, tracking the detected errors in the memory device, determining when the memory device has failed based upon the tracked detected errors and resetting the memory device when the memory device fails testing. Errors can be corrected such that no erroneous data is transacted with the processor.

In one embodiment, the error detection and correction is carried out by a hardware logic device on the data bus, and the failure determination and resetting are performed by software.

The invention tracks how frequently error correction is required and uses this information to determine if the memory device has failed. When a memory device failure is determined, the invention resets the memory device by signaling a power supply of the memory device to cycle.

Errors will appear as a result of ordinary data transactions between the processor and memory device as it operates. The invention also identifies erroneous latchups as latchups detected soon after powering. In this case the indicated latchup is ignored.

In one embodiment, the invention also affirmatively tests the memory device, e.g. by periodically performing a write operation of test data to the memory device, followed by a read operation of the test data from the memory device. A failure of the memory device is determined based upon error correction required in response to the test (e.g. the read operation). However, errors in the test data are corrected such that no erroneous test data is transacted with the processor.

The present invention responds to memory device errors (e.g. SEUs) as well as failures (e.g. SELs). The error correction logic monitors the overall "health" of the data stored within the memory device. This monitoring is facilitated through periodic testing (e.g. read/write operations). When error correction for a memory device becomes excessive, indicating a failure beyond the scope of a simple SEU, a failure is deduced and a memory reset is performed.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

1. Overview

The present invention provides systems and methods for detecting and responding to single event failures in memory devices, such SELs occurring in synchronous dynamic random access memory (SDRAM) in space applications. The invention does not rely upon current measuring and detection hardware to detect and respond to latchups. Instead, the invention detects failures using a memory test (which may be implemented as software or hardware) operating in conjunction with a error detection and correction logic. In the event of a detected failure, a memory reset is directed by cycling the memory power supply for at least the failed memory device, for example. It is possible that the power supply reset will shutdown the entire memory array, or even the entire processor.

The error detection and correction logic operates on the memory bus to cleanse transactions between the CPU and the failure susceptible memory, using inserted check bits to determine whether errors are occurring. The logic reports error rate statistics to the CPU which are used by a program implementing the invention to monitor the health of the memory, however, the memory data as seen by the CPU will be without errors. In addition, the program performs a periodic memory test to each susceptible memory device, for example by executing a write and read operation to the memory device to confirm that it has not latched up.

It should also be understood that although the invention is directed to detecting and responding to single event failures which are the result of radiation exposure in space applications, the cause of the failure is unimportant. The invention will operate to detect and correct a single event failure in a memory device regardless of the application or cause.

2. Hardware and Functional Environment

Figure 1:
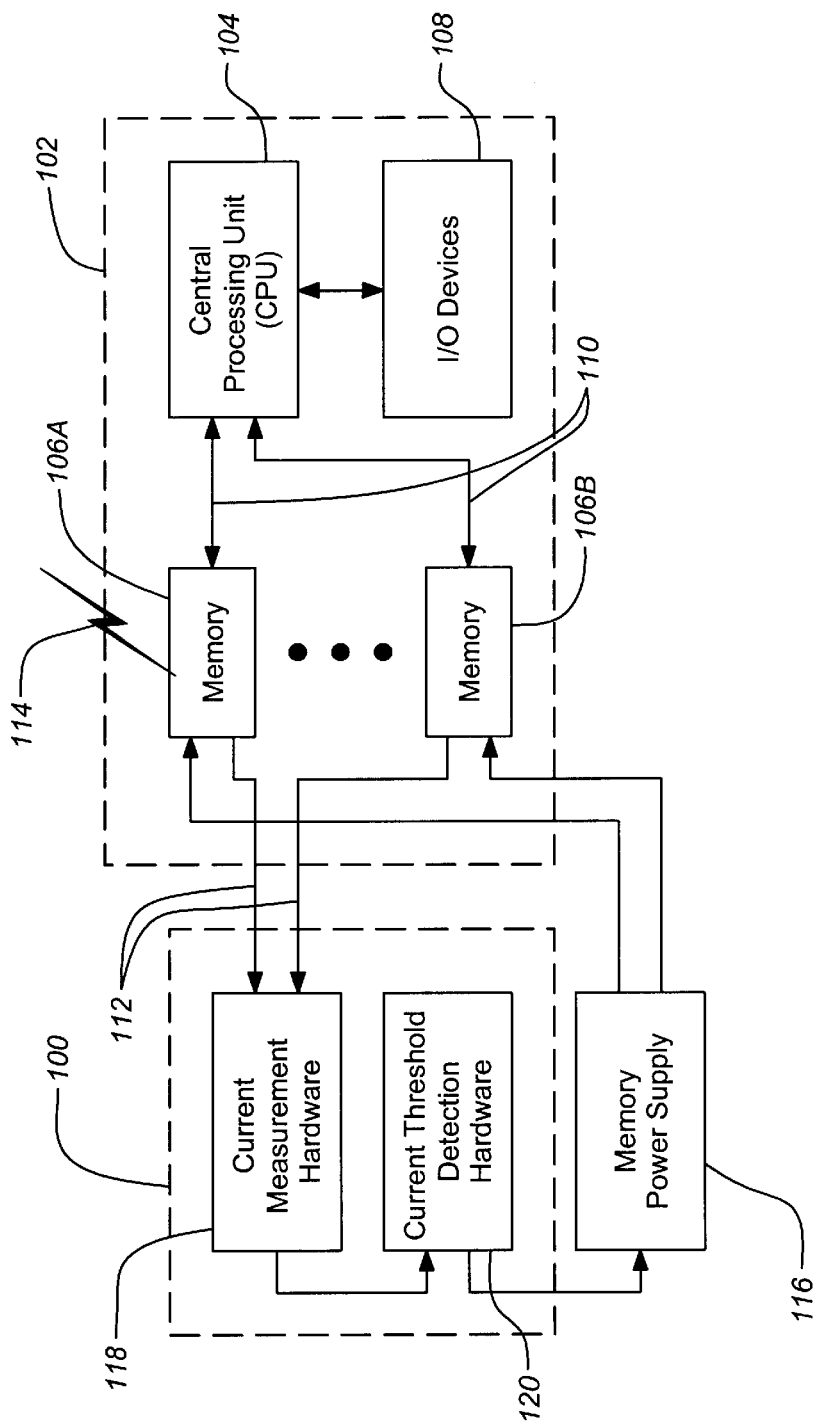
FIG. 1 is a block diagram of a typical prior art system for latchup detection and mitigation.
Figure 2:
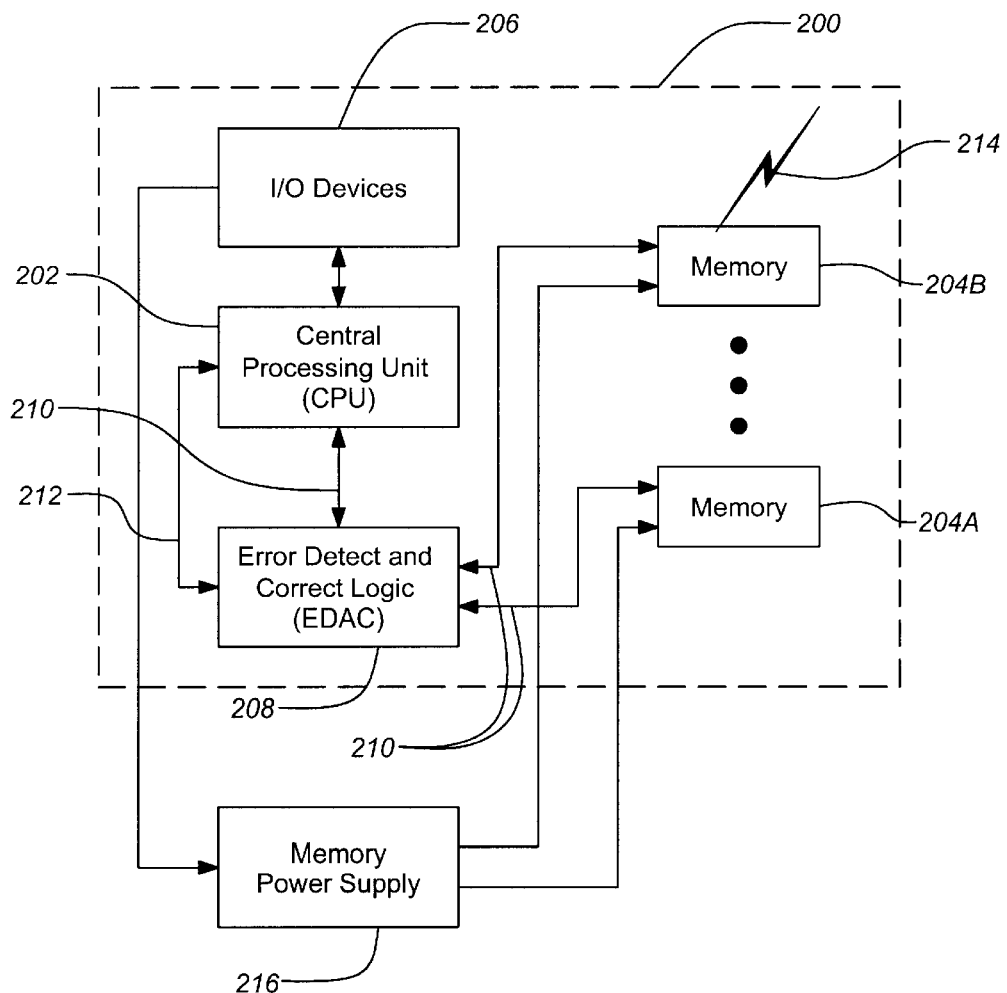
FIG. 2 is a block diagram of an exemplary apparatus of the present invention.

FIG. 2 illustrates an exemplary computer system 200 used to implement a hardware control and/or communications system, such as used in space applications. The computer system 200 comprises a central processing unit (CPU) 202 and one or more memory devices 204A, 204B, such as synchronous dynamic random access memory (SDRAM). The memory devices 204A, 204B can be very high capacity devices (e.g. 64 million bits), thus making them more susceptible to failures, such as latchup. The CPU 202 operates on programs and information stored in the memory devices 204A, 204B. The computer system 200 can also employ support processors (not shown) which operate in conjunction with the CPU 202 to execute programs and controls, including those of the present invention. The CPU 202 interacts with other hardware, receiving and transmitting information and control functions and executing programs, for example, through input/output (I/O) devices 206. In space applications, the I/O devices 206 may relate to the stabilization and control of the spacecraft, such as thruster and control and sensing hardware, or communications operations, such as facilitating high bandwidth communications, however, the invention is applicable to any computerized function employing a memory device 204A, 204B susceptible to failures.

The computer system 200 executes an operating system and a computer application program comprising instructions which, when read and executed by the CPU 202, cause the computer system 200 to perform the steps to implement and/or use the present invention. The computer program and/or operating instructions may also be tangibly embodied as software in the memory 204A, 204B, or as dedicated hardware logic (such as an application specific integrated circuit (ASIC)) and/or provided via I/O devices 206, thereby making a computer program product or article of manufacture according to the invention. As such, the terms "article of manufacture" and "computer program product" as used herein are intended to encompass a computer program accessible from any computer readable device or media. In one embodiment, instructions implementing the operating system and the computer program are tangibly embodied in a computer-readable medium, e.g., data storage device, such as one or more fixed or removable data storage devices, a zip drive, floppy disc drive, hard drive, CD-ROM drive, tape drive, or other medium.

The application program implementing the invention may also exist in a programming language such as COBOL, C++, FORTRAN, or any other language and then be translated into processor readable code by a compiler. After compiling, the application program accesses and manipulates data stored in the memory devices 204A, 204B of the computer system 200 using the relationships and logic that was generated using the compiler.

In one embodiment, detection, correction and tracking of errors are implemented as a hardware device 208 (which may comprise one or more elements). This error detect and correct logic device 208 exists on the data bus 210 in which data is transacted between the CPU 202 and the memory devices 204A, 204B. The device 208 operates to detect and correct errors (from a memory device failure, for example) such that all data transacted the CPU 202 is error free. Thus, the CPU 202 processing is unaffected by errors occurring in the data.

In one embodiment, error detection and correction is implemented by adding check bits to stored data associated with the data. When the data is read back the associated check bits are checked. If the check bits are inconsistent with the data, an error in the data has occurred. The check bits will also identify which bit (or bits) is (are) erroneous so that it (they) can be corrected before the data is transacted with the CPU 202.

The error detection and correction device 208 also tracks the errors that are detected and corrected and reports these to the CPU 202. Error detection and correction control functions and the error statistics can be communicated to the CPU 202 via link 212 on the data bus 210. The error statistics accumulate through both the ordinary operation of the computer system 200 (performing data transactions between the CPU 202 and memory devices 204A, 204B) and as a result of directed memory testing functions.

Memory testing and resetting (in the case of a failed memory device 204A, 204B) is also performed in conjunction with error detection and correction. In one embodiment these functions are performed by software running on the CPU 202. The software directs that a test of each memory device 204A, 204B is periodically conducted to determine if the memory device 204A, 204B is still functioning. For example, the test may simply comprise a write operation of test data to the memory device 204A, 204B and a subsequent read operation of the test data to verify the operational status of the memory device 204A, 204B. Equivalently, a more thorough memory test will include multiple writes and reads to multiple memory addresses. This more thorough test will differentiate between the simple failure of one localized section of a memory device and the failure (presumably due to device latch-up) of an entire memory device. If the memory device 204B has latched (e.g. as a result of incident radiation 214), an erroneous read response will occur resulting in an accumulation of error statistics by the error correct and detect device 208. The error itself will be corrected by the error correct and detect device 208, however, the software will become aware of the error as a result of the tracking performed by the error detection and correction device 208. A high error rate associated with a memory device 204B will be interpreted as a latch by the software, whereas lower error rates will be interpreted as merely SEUs and the power will not be cycled in response.

At a minimum, the error correct and detect device 208 must be able to detect and correct errors which would result from a latchup. In one embodiment the error correct and detect device 208 comprises four double error correct, triple error correct elements.

If a latch is detected, the latched memory device 204B will be reset before any harm occurs in the system (e.g. destructive overheating of the memory device 204B or other components). A reset is directed by the software running on the CPU 202 through an I/O device 206 to the memory power supply 216. The memory power supply 216 then cycles the power to the latched memory device 204B to reset it. Equivalently, power may be cycled to all of the memory devices 204 (including the latched memory device 204B). In one embodiment, power is cycled to the memory device 204 as well as the processor to minimize the possibility of damage occurring to the overall circuit.

Furthermore, in one embodiment, the invention will have a slightly different response if a latchup is detected very soon after powering, e.g. booting up or cycling the power. In this case, the software will conclude that the device has failed completely, perhaps as a result of an SEB. The software will assume that the memory device 204 is not functioning and ignore the presumed latchup.

The apparatus described will detect and eliminate memory device failures which produce data errors as well as latchups. Because interpreting latchups may be performed by software (responding to supplied error statistics), it can be easily adapted to different computer system architectures without additional expensive and heavy hardware.

Many modifications may be made to this configuration without departing from the scope of the present invention. For example, the functions of error detection, correction and tracking and testing and resetting may be divided between one or more software and hardware components. In addition, any combination of the above components, or any number of different components, including different processors, programs, and other devices, may be used to implement the present invention, so long as similar functions are performed thereby.

3. Logic of Invention

Figure 3:
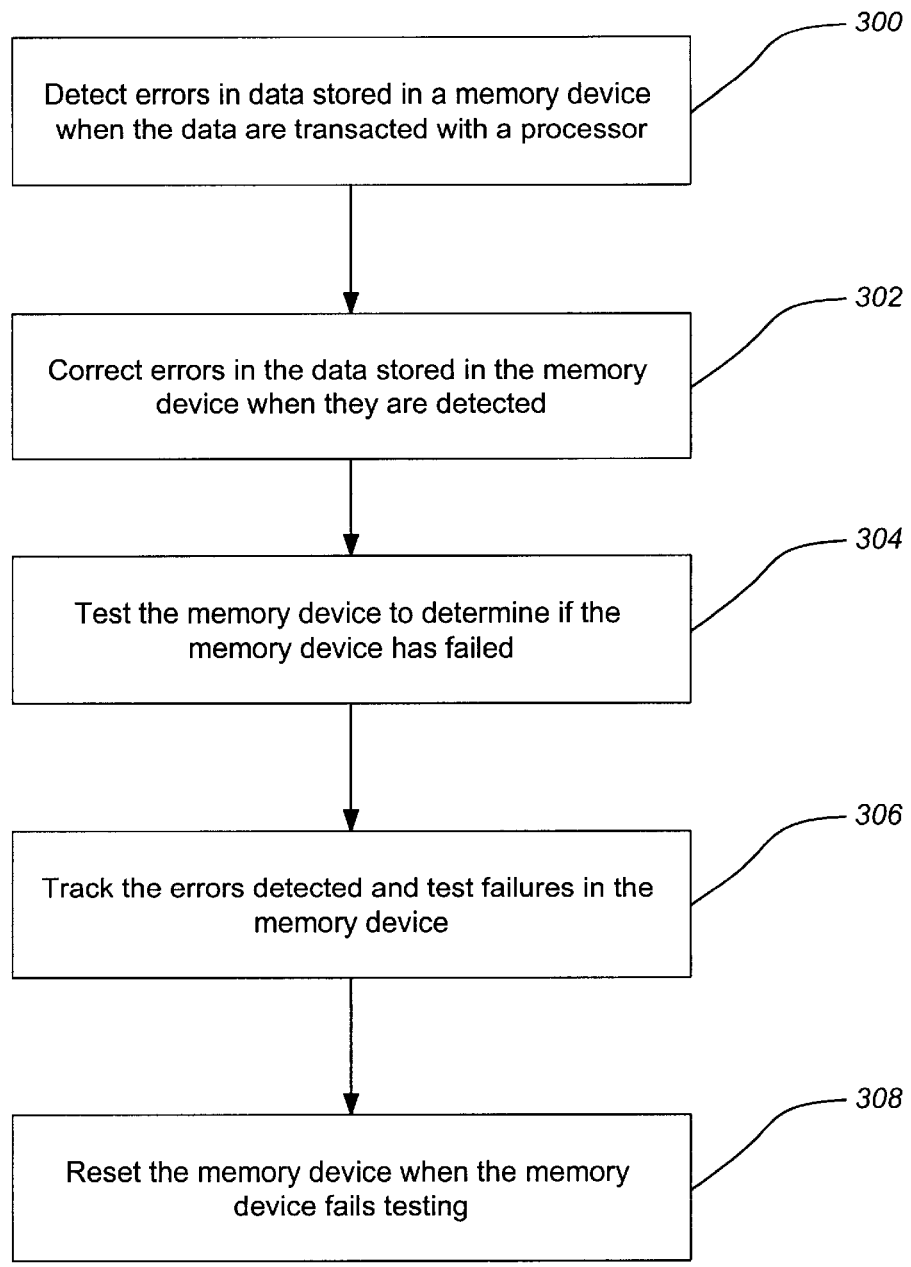
FIG. 3 is flowchart illustrating an exemplary method of the present invention.

FIG. 3 is a flowchart illustrating an exemplary method of the present invention. The method begins with detecting errors in data stored in a memory device from the data transacted with a processor at block 300. The errors in the data stored in the memory device are corrected if they are detected at block 302. The memory device can be tested to check if errors are produced when data is transacted with the processor at block 304. At block 306, the errors in the data of the memory device are tracked. At block 308, it is determined from the tracked errors of the memory device whether the memory device has failed. Finally at block 310, the memory device is reset if the memory device fails testing. The exemplary method may be implemented with software in a hardware environment as previously described.

CONCLUSION

This concludes the description including the preferred embodiments of the present invention. The foregoing description of the preferred embodiment of the invention has been presented for the purposes of illustration and description. It is not intended to be exhaustive or to limit the invention to the precise form disclosed. Many modifications and variations are possible in light of the above teaching.

It is intended that the scope of the invention be limited not by this detailed description, but rather by the claims appended hereto. The above specification, examples and data provide a complete description of the manufacture and use of the apparatus and method of the invention. Since many embodiments of the invention can be made without departing from the scope of the invention, the invention resides in the claims hereinafter appended.

What is claimed is:

1. A method of detecting and correcting memory device failures, comprising the steps of:

detecting errors in data stored in a memory device from the data transacted with a processor;

correcting the detected errors in the data transacted with the processor;

tracking the detected errors in the memory device;

determining if the memory device has failed based upon the tracked detected errors;

resetting the memory device if the memory device fails testing; and affirmatively testing the memory device to check if errors are produced when test data is transacted with the processor.

2. The method of claim 1, wherein the step of correcting errors is performed such that substantially no erroneous data is transacted with the processor.

3. The method of claim 1, wherein the steps of detecting, correcting and tracking are performed by a hardware device.

4. The method of claim 1, wherein the steps of testing and resetting the memory device are performed by software.

5. The method of claim 1, wherein the step of resetting the memory device comprises signaling a power supply of the memory device to cycle.

6. The method of claim 1, wherein the step of resetting the memory device comprises signaling a power supply of the processor and the memory device to cycle.

7. The method of claim 1, wherein the step of tracking the errors occurring in the memory device comprises tracking a frequency of required error correction.

8. The method of claim 1, wherein the memory device is not reset if the memory device fails testing and if the memory device has been recently powered.

9. The method of claim 1, wherein the step of determining when the memory device has failed is based upon error correction tracking in response to testing the memory device.

10. The method of claim 1, wherein a test failure of testing the memory device produces errors in the test data corrected such that substantially no erroneous test data is transacted with the processor.

11. The method of claim 1, wherein the step of testing the memory device comprises periodically performing a write operation of test data to the memory device, followed by a read operation of the test data from the memory device.

12. An article of manufacture embodying logic to detect and correct memory device errors and failures, comprising the steps of:
    detecting errors in data stored in a memory device from the data transacted with a processor;
    correcting the detected errors in the data transacted with the processor;
    tracking the detected errors in the memory device; and
    determining when the memory device has failed based upon the tracked detected errors;
    resetting the memory device when the memory device fails testing; and
    affirmatively testing the memory device to check if errors are produced when test data is transacted with the processor.

13. The article of claim 12, wherein the step of correcting errors is performed such that substantially no erroneous data is transacted with the processor.

14. The article of claim 12, wherein the steps of detecting, correcting and tracking are performed by a hardware device.

15. The article of claim 12, wherein the steps of testing and resetting the memory device are performed by software.

16. The article of claim 12, wherein the step of resetting the memory device comprises signaling a power supply of the memory device to cycle.

17. The article of claim 12, wherein the step of resetting the memory device comprises signaling a power supply of the processor and the memory device to cycle.

18. The article of claim 12, wherein the step of tracking the errors occurring in the memory device comprises tracking a frequency of required error correction.

19. The article of claim 12, wherein the memory device is not reset if the memory device fails testing and if the memory device has been recently powered.

20. The article of claim 12, wherein the step of determining if the memory device has failed is based upon error correction tracking in response to testing the memory device.

21. The article of claim 12, wherein a test failure of testing the memory device produces errors in the test data corrected such that substantially no erroneous test data is transacted with the processor.

22. The article of claim 12, wherein the step of testing the memory device comprises periodically performing a write operation of test data to the memory device, followed by a read operation of the test data from the memory device.

23. An apparatus for detecting memory device failures, comprising:
    an error detection and correction logic device for detecting errors in data stored in a memory device from the data transacted with a processor, correcting the errors in the data stored in the memory device if they are detected, and tracking the detected errors in the data in the memory device; and
    a failure determination and reset device to determine if the memory device has failed based upon the errors detected by the error detection and correction logic device and resetting the memory device when the memory device fails, wherein the failure determination and reset device affirmatively tests the memory device to check if errors are produced when test data is transacted with the processor.

24. The apparatus of claim 23, wherein error correction is performed such that substantially no erroneous data is transacted with the processor.

25. The apparatus of claim 23, wherein detecting, correcting and tracking are performed by a hardware device.

26. The apparatus of claim 23, wherein testing and resetting the memory device is performed by software.

27. The apparatus of claim 23, wherein resetting the memory device comprises signaling a power supply of the memory device to cycle.

28. The apparatus of claim 23, wherein resetting the memory device comprises signaling a power supply of the processor and the memory device to cycle.

29. The apparatus of claim 23, wherein tracking the errors occurring in the memory device comprises tracking a frequency of required error correction.

30. The apparatus of claim 23, wherein the memory device is not reset if the memory device fails testing and if the memory device has been recently powered.

31. The apparatus of claim 23, wherein determining if the memory device has failed is based upon error correction tracking in response to testing the memory device.

32. The apparatus of claim 23, wherein a test failure of testing the memory device produces errors in the test data corrected such that substantially no erroneous test data is transacted with the processor.

33. The apparatus of claim 23, wherein testing the memory device comprises periodically performing a write operation of test data to the memory device, followed by a read operation of the test data from the memory device.

34. A method of detecting and correcting memory device failures, comprising the steps of:
    detecting errors in data stored in a memory device from the data transacted with a processor;
    correcting the detected errors in the data transacted with the processor;

tracking the detected errors in the memory device;

determining if the memory device has failed based upon the tracked detected errors; and resetting the memory device if the memory device fails testing;

wherein the memory device is not reset if the memory device fails testing and if the memory device has been recently powered.

35. An article of manufacture embodying logic to detect and correct memory device errors and failures, comprising the steps of:

detecting errors in data stored in a memory device from the data transacted with a processor;

correcting the detected errors in the data transacted with the processor;

tracking the detected errors in the memory device; and determining when the memory device has failed based upon the tracked detected errors; and resetting the memory device when the memory device fails testing;

wherein the memory device is not reset if the memory device fails testing and if the memory device has been recently powered.

36. An apparatus for detecting memory device failures, comprising:

an error detection and correction logic device for detecting errors in data stored in a memory device from the data transacted with a processor, correcting the errors in the data stored in the memory device if they are detected, and tracking the detected errors in the data in the memory device; and a failure determination and reset device to determine if the memory device has failed based upon the errors detected by the error detection and correction logic device and resetting the memory device when the memory device fails, wherein the memory device is not reset if the memory device fails testing and if the memory device has been recently powered.

\* \* \* \* \*